(12) United States Patent
Liu

(10) Patent No.: US 11,798,914 B2
(45) Date of Patent: Oct. 24, 2023

(54) METHODS AND STRUCTURES FOR DIE-TO-DIE BONDING

(71) Applicant: YANGTZE MEMORY TECHNOLOGIES CO., LTD., Wuhan (CN)

(72) Inventor: Jun Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 788 days.

(21) Appl. No.: 16/727,866

(22) Filed: Dec. 26, 2019

(65) Prior Publication Data

US 2021/0111150 A1 Apr. 15, 2021

Related U.S. Application Data

(63) Continuation of application No. PCT/CN2019/110727, filed on Oct. 12, 2019.

(51) Int. Cl.
*H01L 23/00* (2006.01)
*H01L 21/78* (2006.01)
(Continued)

(52) U.S. Cl.
CPC .......... *H01L 24/95* (2013.01); *H01L 21/6835* (2013.01); *H01L 21/6836* (2013.01);
(Continued)

(58) Field of Classification Search
CPC ............. H01L 21/6835; H01L 21/6836; H01L 2221/68309; H01L 2221/68313;
(Continued)

(56) References Cited

U.S. PATENT DOCUMENTS

| 2003/0157782 A1 | 8/2003 | Kellar et al. |
| 2008/0303139 A1 | 12/2008 | Bernstein et al. |

(Continued)

FOREIGN PATENT DOCUMENTS

| CN | 101863449 A | 10/2010 |
| CN | 102194804 A | 9/2011 |

(Continued)

OTHER PUBLICATIONS

International Search Report issued in corresponding International Application No. PCT/CN2019/110727, dated Jul. 9, 2020, 5 pages.

*Primary Examiner* — Brigitte A Paterson
(74) *Attorney, Agent, or Firm* — BAYES PLLC

(57) ABSTRACT

Embodiments of die-to-die bonding schemes of three-dimensional (3D) memory devices are provided. In an example, a method for bonding includes dicing one or more device wafers to obtain a plurality of dies, placing at least one first die of the plurality of dies onto a first carrier wafer and at least one second die of the plurality of dies onto a second carrier wafer, and bonding the at least one first die each with a respective second die. The at least one first die and the at least one second die each are functional. In some embodiments, the method also includes removing, respectively, the first carrier wafer and the second carrier wafer to form a plurality of bonded semiconductor devices each having one of the first dies and the respective second die.

20 Claims, 15 Drawing Sheets

(51) Int. Cl.
  *H01L 25/18* (2023.01)
  *H01L 25/00* (2006.01)
  *H01L 25/065* (2023.01)
  *H01L 21/683* (2006.01)

(52) U.S. Cl.
  CPC .............. *H01L 21/78* (2013.01); *H01L 24/91* (2013.01); *H01L 25/0657* (2013.01); *H01L 25/18* (2013.01); *H01L 25/50* (2013.01); *H01L 2221/68309* (2013.01); *H01L 2221/68313* (2013.01); *H01L 2221/68327* (2013.01); *H01L 2221/68363* (2013.01); *H01L 2224/08145* (2013.01); *H01L 2224/95001* (2013.01); *H01L 2225/06524* (2013.01); *H01L 2225/06541* (2013.01); *H01L 2225/06565* (2013.01)

(58) Field of Classification Search
  CPC . H01L 2221/68327; H01L 2221/68363; H01L 2224/08145; H01L 2224/80006; H01L 25/0657; H01L 25/18; H01L 25/50; H01L 2225/06524; H01L 2225/06541; H01L 2225/06565
  See application file for complete search history.

(56) References Cited

U.S. PATENT DOCUMENTS

| | | |
|---|---|---|
| 2011/0215470 A1 | 9/2011 | Chen et al. |
| 2012/0013013 A1 | 1/2012 | Sadaka et al. |
| 2013/0015589 A1* | 1/2013 | Liao .................... H01L 25/0657 257/E25.011 |
| 2013/0285259 A1 | 10/2013 | Han |
| 2017/0179077 A1 | 6/2017 | Lin et al. |
| 2017/0200711 A1* | 7/2017 | Uzoh .................. H01L 21/6836 |
| 2018/0308819 A1 | 10/2018 | Uzoh |
| 2021/0057332 A1* | 2/2021 | Chen .................... H01L 21/6836 |

FOREIGN PATENT DOCUMENTS

| | | |
|---|---|---|
| CN | 102484099 A | 5/2012 |
| CN | 103221834 A | 7/2013 |
| CN | 105493257 A | 4/2016 |
| CN | 106601633 A | 4/2017 |
| CN | 107123604 A | 9/2017 |
| CN | 109659267 A | 4/2019 |
| CN | 110034103 A | 7/2019 |
| CN | 110192269 A | 8/2019 |
| CN | 110199385 A | 9/2019 |
| CN | 110249427 A | 9/2019 |
| CN | 110892521 A | 3/2020 |
| JP | 2009253114 A | 10/2009 |
| JP | 2012114214 A | 6/2012 |
| JP | 2013503488 A | 1/2013 |
| JP | 2019081194 A | 5/2019 |
| KR | 10-2019-0049468 A | 5/2019 |
| TW | 1618160 B | 3/2018 |
| WO | 2015040798 A1 | 3/2015 |
| WO | 2017223345 A1 | 12/2017 |

* cited by examiner

300

(I)

(II)

400

400

(I)

(II)

(I)

(II)

METHODS AND STRUCTURES FOR DIE-TO-DIE BONDING

CROSS-REFERENCE TO RELATED APPLICATIONS

This application is continuation of International Application No. PCT/CN2019/110727, filed on Oct. 12, 2019, entitled "METHODS AND STRUCTURES FOR DIE-TO-DIE BONDING," which is hereby incorporated by reference in its entirety.

BACKGROUND

Embodiments of the present disclosure relate to methods and structures used in a die-to-die bonding scheme.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit. A 3D memory architecture can address the density limitation in planar memory cells. The 3D memory architecture includes a memory array and peripheral devices for controlling signals to and from the memory array.

A 3D semiconductor device can be formed by stacking semiconductor wafers or dies and interconnecting them vertically using, for instance, through-silicon vias (TSVs) or copper-to-copper (Cu—Cu) connections, so that the resulting structure acts as a single device to achieve performance improvements at reduced power and smaller footprint than conventional planar processes. Among the various techniques for stacking semiconductor wafers or dies, bonding is recognized as one of the promising techniques.

SUMMARY

Embodiments of methods and structures for die-to-die bonding are disclosed herein.

In one example, a method for bonding includes dicing one or more device wafers to obtain a plurality of dies, placing at least one first die of the plurality of dies onto a first carrier wafer and at least one second die of the plurality of dies onto a second carrier wafer, and bonding the at least one first die each with a respective second die. The at least one first die and the at least one second die each are functional. In some embodiments, the method also includes removing, respectively, the first carrier wafer and the second carrier wafer to form a plurality of bonded semiconductor devices each having one of the first dies and the respective second die.

In another example, a method for bonding includes dicing one or more device wafers to obtain a plurality of dies and placing at least one first die of the plurality of dies into respective first openings in a first carrier wafer. The at least one first die includes a uniform distribution on the first carrier wafer. In some embodiments, the method further includes bonding the at least one first die with a device layer on a second carrier wafer and removing, respectively, the first carrier wafer and the second carrier wafer.

In still another example, a structure for bonding includes a plurality of first openings in a first carrier wafer, a first adhesive portion on a bottom of each of the plurality of first openings, and a first die attached to the adhesive portion in each of the plurality of first openings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
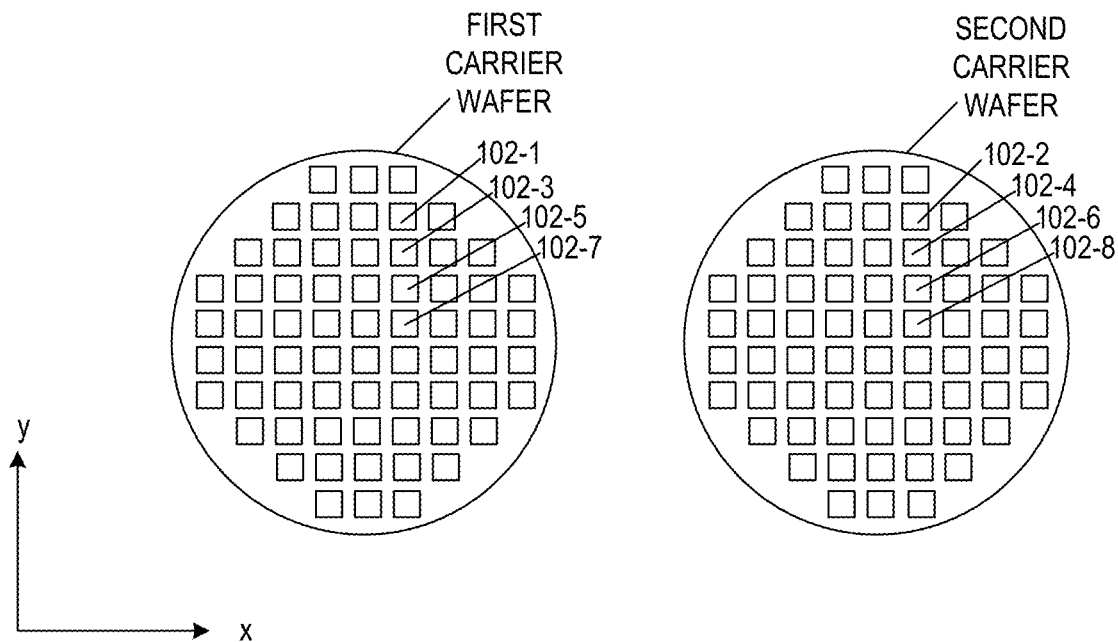
FIG. 1A illustrates a schematic top view of an exemplary pair of carrier wafers for bonding, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

As used herein, a "device wafer" is a piece of a semiconductor material for semiconductor devices to build in and/or on it and that can undergo various fabrication processes before being separated into dies. As used herein, a "carrier wafer" (also known as "carrier" or "support wafer") is a type of wafer for temporary supporting structures attached on it and that does not include any semiconductor device permanently built therein and/or thereon. The materials of a carrier wafer can include semiconductor materials or any other suitable materials, such as glass, polymer, sapphire, etc.

Figure 6:
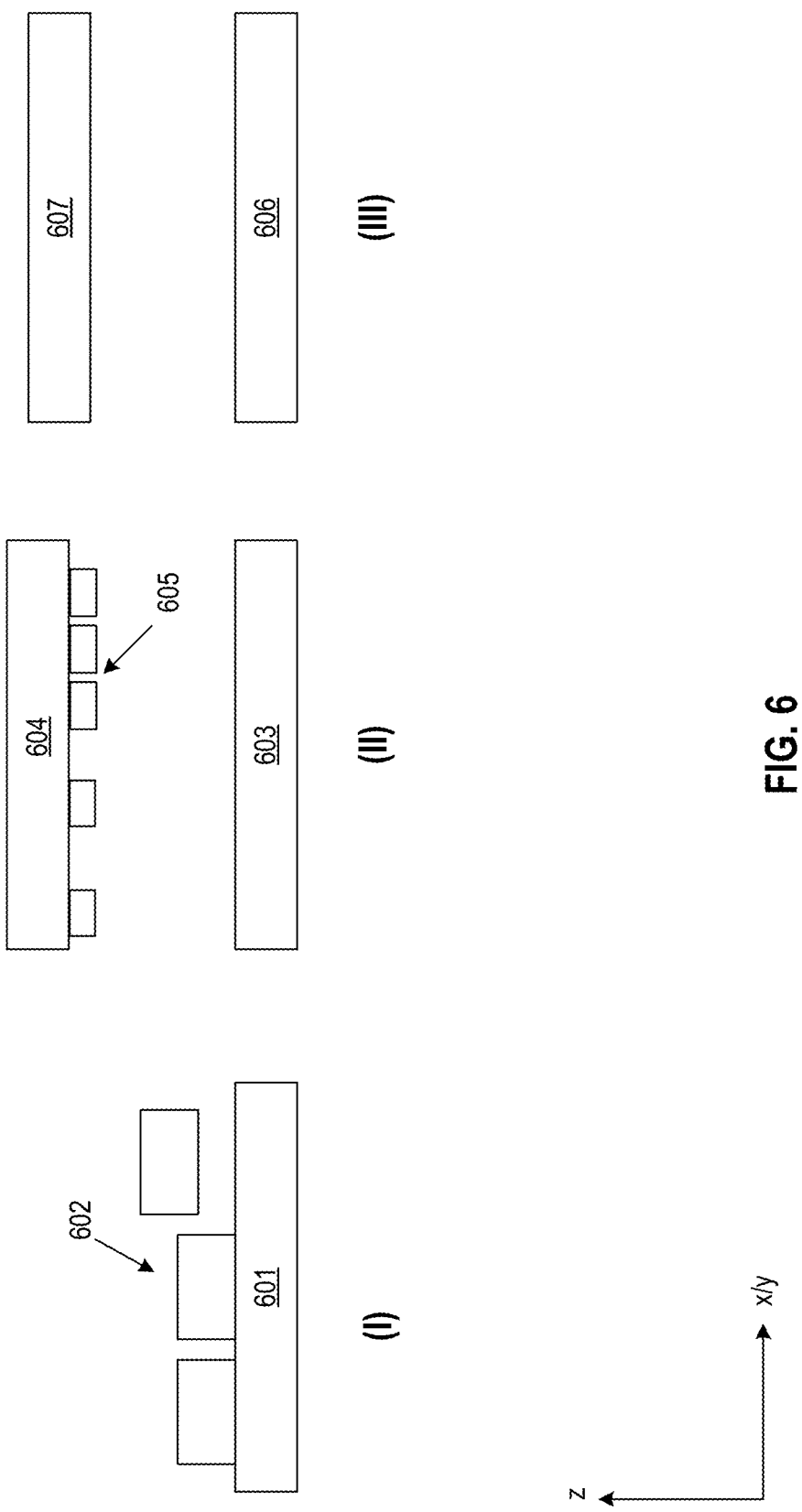
FIG. 6 illustrates examples of related bonding schemes.

Conventionally, ways for stacking of semiconductor devices, e.g., 3D memory devices, include bonding schemes such as chip-to-chip bonding, chip-to-wafer bonding, collective die-to-wafer bonding, and wafer-to-wafer bonding. FIG. 6 illustrates examples of (I) chip-to-wafer bonding, (II) die-to-wafer bonding, and (III) wafer-to-wafer bonding. In (I), chips 602 are bonded onto wafer 601; in (II), dies 605 attached to a carrier wafer 604 are bonded onto wafer 603; and in (III), wafer 607 is bonded onto wafer 606. Often, layouts of wafers can limit the placement of chips and dies, causing waste of space and reduction of throughput in chip-to-chip bonding and chip-to-wafer bonding. Wafer-to-wafer bonding can have higher throughput but suffer from lower yield issues due to the uncertainty of fabrication processes. Collective die-to-wafer bonding can have higher throughput, but its yield is limited by the device yield on the wafer, and the distribution of dies on the carrier wafer can be non-uniform, causing waste of space on the wafer and the carrier wafer. Thus, bonding methods for device stacking thus need to be improved.

Various embodiments in accordance with the present disclosure provide methods and structures used in device stacking. Specifically, methods and structures for die-to-die bonding are provided. To increase yield, in some embodiments, device wafers are diced and functional dies are selected for bonding. The functional dices are then placed on respective carrier wafers. One of the carrier wafers is then flipped upside down such that dies on one carrier wafer can be aligned with dies on the other carrier wafer. Each die on one carrier wafer is bonded with a corresponding die on the other carrier wafer. In some embodiments, openings/sockets are formed in at least one carrier wafer to hold the respective dies so that the alignment and placement of dies can be of higher precision. The top surface of each die, in an opening, may be equal to or higher than the top surface of the carrier wafer for easy debonding. The dies may be placed on the carrier wafers in any suitable distribution. In some embodiments, the dies are placed on the respective carrier wafer in a uniform distribution, e.g., adjacent dies are separated from neighboring dies by about the same spacing. In some embodiments, the dies have full coverage over the respective carrier wafer. That is, the dies may be placed at all usable area on the carrier wafer to increase throughput.

FIG. 1A illustrates a schematic top view of a pair of carrier wafers and the dies attached to the carrier wafers for die-to-die bonding, according to some embodiments. As shown in FIG. 1A, a plurality of first dies (e.g., 102-1, 102-3, 102-5, and 102-7) are attached to a first carrier wafer, and a plurality of second dies (e.g., 102-2, 102-4, 102-6, and 102-8) are attached to a second carrier wafer. At least some of the first dies and the second die are functional. In some embodiments, all first dies and all second dies are functional.

The first dies and the second dies may each include various types of structures/devices. For example, a first die may include a plurality of memory cells (e.g., memory stack with memory strings intersecting with conductor layers), and a respective second die may include a plurality of circuit components (e.g., page buffers, decoders, sense amplifiers, drivers, charge pumps, current or voltage references, or any active or passive components of the circuits such as transistors, diodes, resistors, or capacitors) for controlling the operations of the memory cells. The first dies and the second dies may be selected from dies formed by dicing one or more device wafers. Each first die may be subsequently bonded to a respective second die to facilitate the conductive connection between the first die and the second die. The first and second dies may be placed on a respective carrier wafer in any desirable pattern/distribution. In some embodiments, the first dies have a uniform distribution over the first carrier wafer. Accordingly, the second dies also have a uniform distribution over the second carrier wafer. That is, first and second dies are each separated from adjacent/neighboring dies by nominally the same spacing. In some embodiments, the first dies and the second dies each has full coverage over the respective carrier wafer. For example, a maximum number of the first dies and the second dies can be placed on the usable area (e.g., all usable area) of the respective carrier wafer to increase the throughput.

Figure 1B:
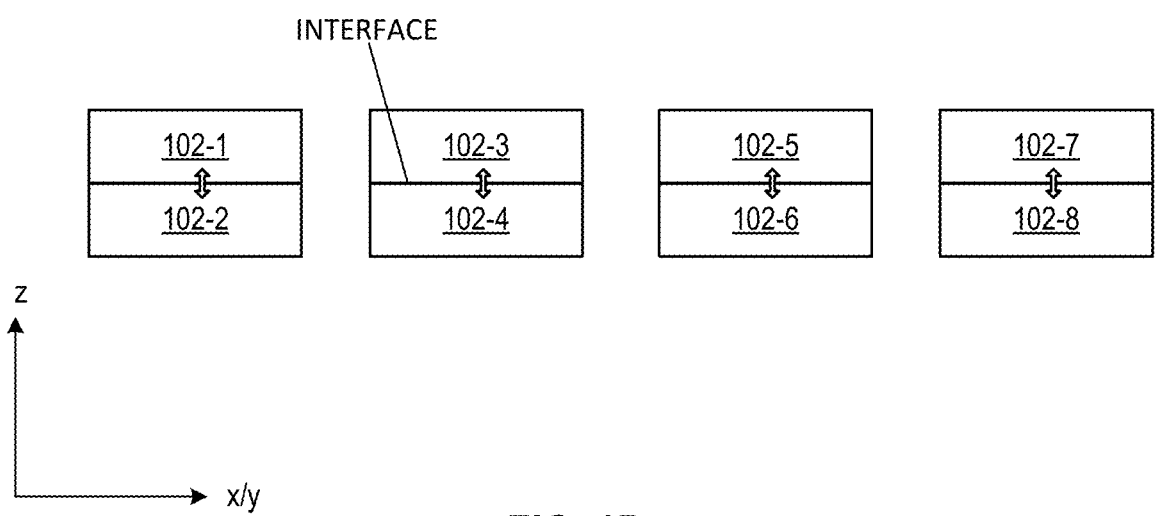
FIG. 1B illustrates a schematic cross-sectional view of a plurality of bonded semiconductor devices formed from the bonding of dies in the pair of carrier wafers in FIG. 1A, according to some embodiments.

FIG. 1B illustrates a schematic cross-sectional view of a plurality of bonded semiconductor devices formed by the die-to-die bonding method/scheme, according to some embodiments. Each first die is bonded to a respective second die. As shown in FIG. 1B, first dies 102-1, 102-3, 102-5, and 102-7 are respectively bonded to second dies 102-2, 102-4, 102-6, and 102-8. Each bonded first die and second die may form a bonded semiconductor device. An interface may be formed, e.g., by any suitable bonding method, between each first die and the corresponding second die. Bonds may be formed between the first die and the respective second bond at the interface. In some embodiments, hybrid bonding may be used to bond the first dies to the second dies, and the interface includes fusion bond and covalent bond. Electrical signals, e.g., voltages, may be transmitted through the interface. In various embodiments, more than two dies may be stacked vertically, e.g., using more than two carrier wafers.

Figure 2:
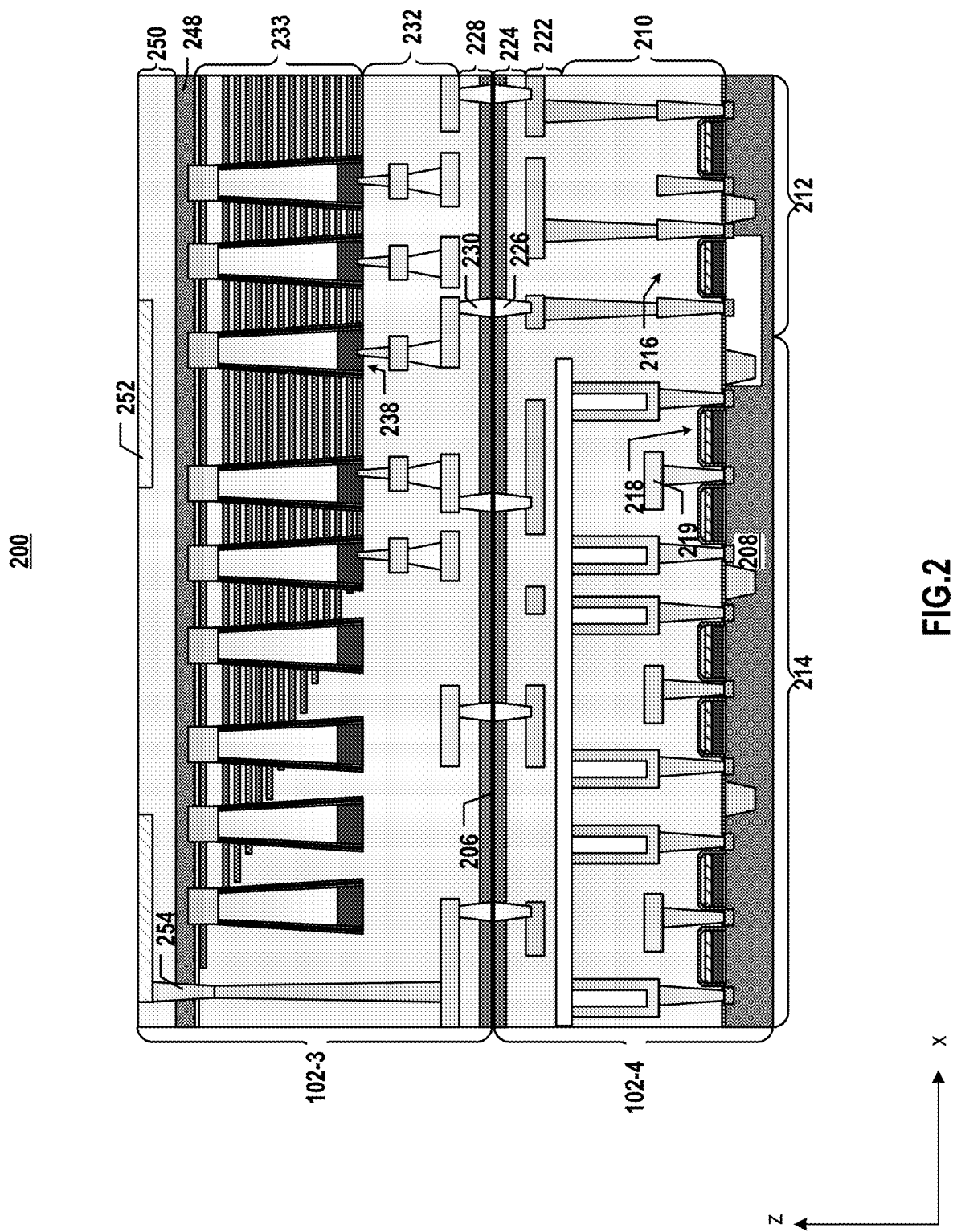
FIG. 2 illustrates a detailed schematic cross-sectional view of an exemplary bonded semiconductor device, according to some embodiments.

FIG. 2 illustrates an exemplary structure of a bonded semiconductor device 200, according to some embodiments. Bonded semiconductor device 200 may represent an example of a bonded semiconductor device. Bonded semiconductor device 200 may include a second die 102-4 and a first die 102-3 stacked over second die 102-4. First die 102-3 and second die 102-4 are joined at a bonding interface 206 therebetween. It should be noted that bonded semiconductor device 200 merely represents an example of the structure resulted from the bonding of two dies (e.g., first die 102-3 and second die 102-4), and is not meant to limit the structures/devices that can be formed in the dies. First die 102-3 and second die 102-4 each can also include any suitable structures/devices that can be bonded to form a bonded semiconductor device. As shown in FIG. 2, second die 102-4 can include a substrate 208, which can include silicon (e.g., single crystalline silicon), silicon germanium (SiGe), gallium arsenide (GaAs), germanium (Ge), silicon on insulator (SOI), or any other suitable materials.

Second die 102-4 can include a device layer 210 above substrate 208. It is noted that x and z axes are added in FIG. 2 to further illustrate the spatial relationship of the components in bonded semiconductor device 200. Substrate 208 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., bonded semiconductor device 200) is determined relative to the substrate of the semiconductor device (e.g., substrate 208) in the z-direction (the vertical direction or thickness direction) when the substrate is positioned in the lowest plane of the semiconductor device in the z-direction. The same notion for describing the spatial relationship is applied throughout the present disclosure.

Device layer 210 may include any suitable devices/structures that can be bonded to first die 102-3. In some embodiments, device layer 210 includes a peripheral circuit 212 on substrate 208 and an array of embedded DRAM (dynamic random-access memory) cells 214 on substrate 208 and outside of peripheral circuit 212. In some embodiments, peripheral circuit 212 includes a plurality of peripheral transistors 216 forming any suitable digital, analog, and/or mixed-signal peripheral circuits used for facilitating the operation of bonded semiconductor device 200 including, but not limited to, a page buffer, a decoder (e.g., a row decoder and a column decoder), a sense amplifier, a driver, a charge pump, a current or voltage reference. Peripheral transistors 216 can be formed "on" substrate 208, in which the entirety or part of peripheral transistors 216 are formed in substrate 208 (e.g., below the top surface of substrate 208) and/or directly on substrate 208. Isolation regions (e.g., shallow trench isolations (STIs)) and doped regions (e.g., source regions and drain regions of peripheral transistors 216) can be formed in substrate 208 as well.

In some embodiments, each embedded DRAM cell 214 includes a DRAM selection transistor 218 and a capacitor. Embedded DRAM cell 214 can be a nTnC cell consisting of n transistor and n capacitor, n being a positive integer. In some embodiments, DRAM selection transistors 218 are formed "on" substrate 208, in which the entirety or part of DRAM selection transistors 218 are formed in substrate 208 (e.g., below the top surface of substrate 208) and/or directly on substrate 208. A node of each DRAM selection transistor 218 is electrical connected to a bit line 219 of embedded DRAM, according to some embodiments. It is understood that any other suitable structure can be formed next to peripheral circuit 212.

In some embodiments, second die 102-4 of bonded semiconductor device 200 further includes an interconnect layer 222 above device layer 210 to transfer electrical signals to and from peripheral circuit 212 and array of embedded DRAM cells 214. Interconnect layer 222 can include a plurality of interconnects (also referred to herein as "contacts"), including lateral interconnect lines and vertical interconnect access (via) contacts. The interconnect lines and via contacts in interconnect layer 222 can include conductive materials including, but not limited to, tungsten (W), cobalt (Co), copper (Cu), aluminum (Al), silicides, or any combination thereof.

As shown in FIG. 2, second die 102-4 of bonded semiconductor device 200 can further include a bonding layer 224 at bonding interface 206 and above interconnect layer 222 and device layer 210. Bonding layer 224 can include a plurality of bonding contacts 226 and dielectrics electrically isolating bonding contacts 226. Bonding contacts 226 can include conductive materials including, but not limited to, W, Co, Cu, Al, silicides, or any combination thereof. The remaining area of bonding layer 224 can be formed with dielectrics including, but not limited to, silicon oxide, silicon nitride, silicon oxynitride, low-k dielectrics, or any combination thereof. Bonding contacts 226 and surrounding dielectrics in bonding layer 224 can be used for hybrid bonding.

As shown in FIG. 2, first die 102-3 of bonded semiconductor device 200 can also include a bonding layer 228 at bonding interface 206 and above bonding layer 224 of second die 102-4. Bonding layer 228 can include a plurality of bonding contacts 230 and dielectrics electrically isolating bonding contacts 230. Bonding contacts 230 can include conductive materials including, but not limited to, W, Co, Cu, Al, silicides, or any combination thereof. The remaining area of bonding layer 228 can be formed with dielectrics including, but not limited to, silicon oxide, silicon nitride, silicon oxynitride, low-k dielectrics, or any combination thereof. Bonding contacts 230 and surrounding dielectrics in bonding layer 228 can be used for hybrid bonding.

As described above, first die 102-3 can be bonded on top of second die 102-4 in a face-to-face manner at bonding interface 206. In some embodiments, bonding interface 206 is disposed between bonding layers 224 and 228 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 206 is the place at which bonding layers 224 and 228 are met and bonded. In practice, bonding interface 206 can be a layer with a certain thickness that includes the top surface of bonding layer 224 of second die 102-4 and the bottom surface of bonding layer 228 of first die 102-3.

In some embodiments, first die 102-3 of bonded semiconductor device 200 further includes an interconnect layer 232 above bonding layer 228 to transfer electrical signals. Interconnect layer 232 can include a plurality of interconnects and can further include one or more ILD layers in which the interconnect lines and via contacts can form. The interconnect lines and via contacts in interconnect layer 232 can include conductive materials including, but not limited to, W, Co, Cu, Al, silicides, or any combination thereof. The ILD layers in interconnect layer 232 can include dielectric materials including, but not limited to, silicon oxide, silicon nitride, silicon oxynitride, low-k dielectrics, or any combination thereof.

In some embodiments, first die 102-3 of bonded semiconductor device 200 includes a NAND flash memory device in which memory cells are provided in the form of an array of 3D NAND memory strings 238 above interconnect layer 232 and bonding layer 228. Each 3D NAND memory string 238 extends vertically through a plurality of pairs each including a conductor layer and a dielectric layer, according to some embodiments. The stacked and interleaved conductor layers and dielectric layers are also referred to herein as a memory stack 233. The interleaved conductor layers and dielectric layers in memory stack 233 alternate in the vertical direction, according to some embodiments. In other words, except for the ones at the top or bottom of memory stack 233, each conductor layer can be adjoined by two dielectric layers on both sides, and each dielectric layer can be adjoined by two conductor layers on both sides. The conductor layers and the dielectric layers can each have the same thickness or different thicknesses. The conductor layers can include conductor materials including, but not limited to, W, Co, Cu, Al, doped silicon, silicides, or any combination thereof. The dielectric layers can include dielectric materials including, but not limited to, silicon oxide, silicon nitride, silicon oxynitride, or any combination thereof.

In some embodiments, each 3D NAND memory string 238 is a "charge trap" type of NAND memory string including a semiconductor channel and a memory film. In some embodiments, the semiconductor channel includes silicon, such as amorphous silicon, polysilicon, or single crystalline silicon. In some embodiments, the memory film is a composite dielectric layer including a tunneling layer, a storage layer (also known as "charge trap/storage layer"), and a blocking layer. Each memory string 238 can have a cylinder shape (e.g., a pillar shape). The semiconductor channel, the tunneling layer, the storage layer, and the blocking layer of memory film are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the blocking layer can include a composite layer of silicon oxide/silicon oxynitride/silicon oxide (ONO). In another example, the blocking layer can include a high-k dielectric layer, such as an aluminum oxide ($Al_2O_3$), or hafnium oxide ($HfO_2$) or tantalum oxide ($Ta_2O_5$) layer, and so on. In some embodiments, 3D NAND memory strings 238 further include a plurality of control gates (each being part of a word line). Each conductor layer in memory stack 233 can act as a control gate for each memory cell of 3D NAND memory string 238.

In some embodiments, first die 102-3 further includes semiconductor layer 248 disposed above memory stack 233 and 3D NAND memory strings 238. Semiconductor layer 248 can be a thinned substrate on which memory stack 233 and 3D NAND memory strings 238 are formed. In some embodiments, semiconductor layer 248 includes single-crystal silicon. In some embodiments, semiconductor layer 248 can include polysilicon, amorphous silicon, SiGe, GaAs, Ge, or any other suitable materials.

As shown in FIG. 2, first die 102-3 of bonded semiconductor device 200 can further include a pad-out interconnect layer 250 above semiconductor layer 248. Pad-out interconnect layer 250 include interconnects, e.g., contact pads 252, in one or more ILD layers. The pad-out interconnect layer 250 and interconnect layer 232 can be formed at opposite sides of semiconductor layer 248. In some embodiments, the interconnects in pad-out interconnect layer 250 can transfer electrical signals between bonded semiconductor device 200 and outside circuits, e.g., for pad-out purposes.

In some embodiments, first die 102-3 further includes one or more contacts 254 extending through semiconductor layer 248 to electrically connect pad-out interconnect layer 250 and interconnect layers 232 and 222. As a result, array of embedded DRAM cells 214 can be electrically connected to array of 3D NAND memory strings 238 through interconnect layers 222 and 232 as well as bonding contacts 226 and 230. Moreover, peripheral circuit 212, array of embedded DRAM cells 214, and array of 3D NAND memory strings 238 can be electrically connected to outside circuits through contacts 254 and pad-out interconnect layer 250.

Figure 5A:
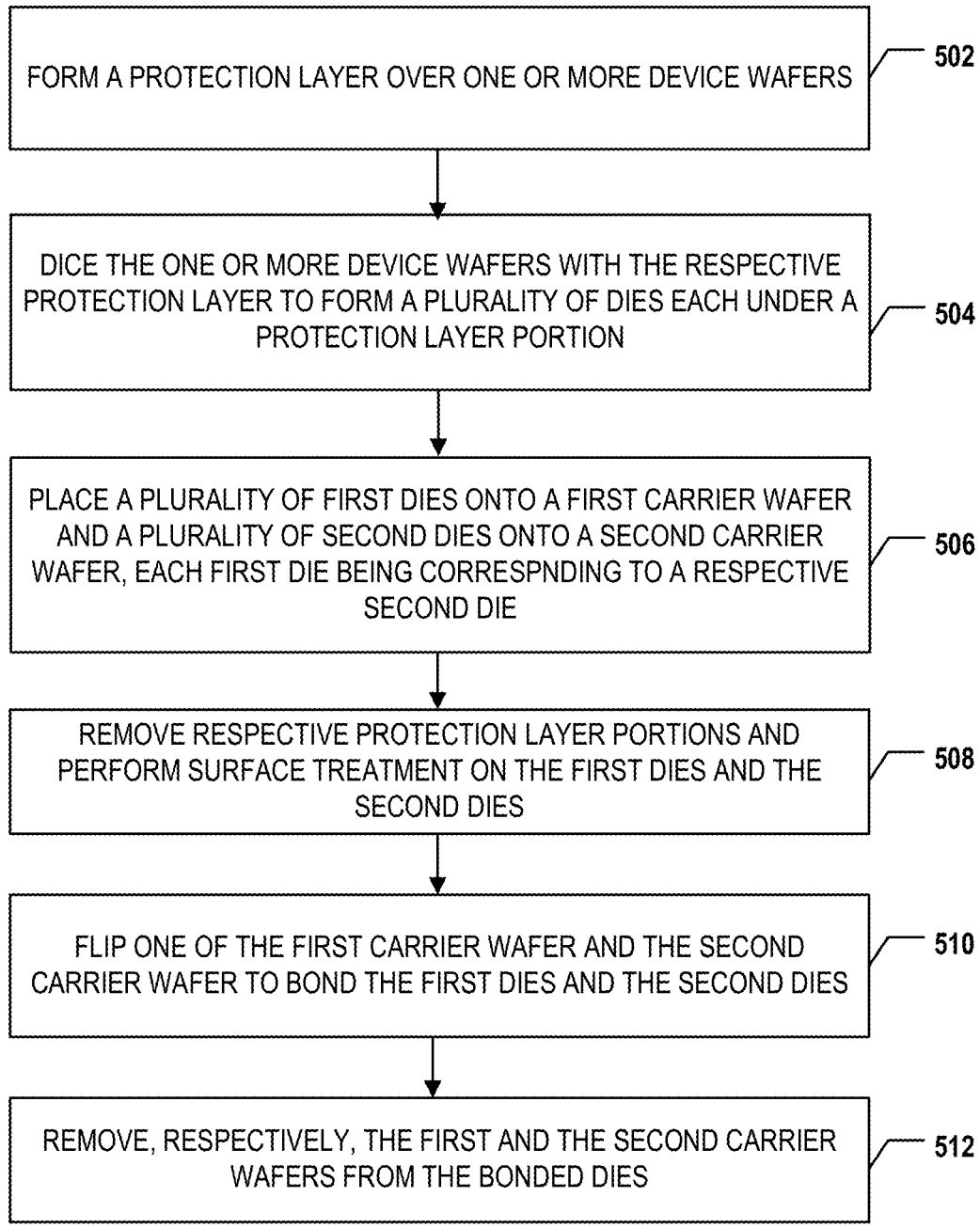
FIGS. 5A and 5B each is a flowchart of an exemplary method for die-to-die bonding, according to some embodiments.

FIGS. 3A-3G illustrate an exemplary fabrication method 300 for forming the bonded semiconductor devices, according to some embodiments. FIG. 5A illustrates a flowchart 500 of fabrication method 300. For ease of illustration, FIGS. 3A-3G and 5A are described together. It is understood that the operations shown in method 300 are not exhaustive and that other operations can be performed as well before, after, or between any of the illustrated operations. Further, some of the operations may be performed simultaneously, or in a different order than shown in FIG. 5A.

Figure 3A:
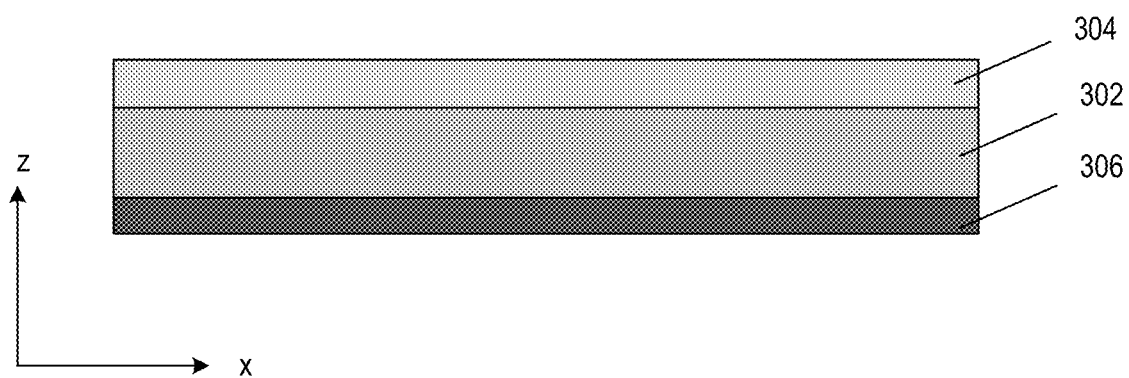
FIGS. 3A-3H illustrates an exemplary fabrication process for forming a plurality of bonded semiconductor devices, according to some embodiments.

Referring to FIG. 5A, method 300 starts at operation 502, as illustrated in FIG. 3A, in which a protection layer is formed over one or more device wafers. As shown in FIG. 3A, a protection layer 304 is formed over a device wafer 302. In some embodiments, device wafer 302 is over and attached to an adhesive tape 306 for subsequent fabrication operations such as dicing. Protection layer 304 may include any suitable materials that can prevent device wafer 302 from being damaged in the subsequent dicing operation. Protection layer 304 may include a soft material (e.g., photoresist), a hard material (e.g., carbon, silicon oxide, and silicon nitride), or a combination thereof. Protection layer 304 may be a single-layered structure or a multi-layered structure. In some embodiments, protection layer 304 includes a layer of photoresist and is spun on device wafer 302.

Device wafer 302 includes any structures/devices for bonding in subsequent operations. In some embodiments, device wafer 302 includes a semiconductor layer (e.g., 248) and a plurality of structures/devices formed in and/or on the semiconductor layer. The structures/devices may be formed in dies, which can be separated in the subsequent dicing operation. In some embodiments, the structures/devices in device wafer 302 include memory arrays and interconnects in contact with the memory arrays. For example, the memory arrays may include a plurality of memory stacks (e.g., 233) and memory strings (e.g., 238), and the interconnects may include various interconnects in an interconnect layer (e.g., 232). Device wafer 302 may also include a bonding layer (e.g., 228) and a plurality of bonding contacts (e.g., 230) in the bonding layer and exposed at the top surface of device wafer 302. Device wafer 302 may also include other structures/devices such as peripheral circuits (e.g., 212), storage elements (e.g., DRAM cells), a bonding layer (e.g., 224), a plurality of bonding contacts (e.g., 226) in the bonding layer, and any other suitable structures/devices that can be formed on the same semiconductor layer with the memory arrays to be diced and bonded in subsequent operations.

In some embodiments, a protection layer is formed respectively over more than one device wafer, which are diced subsequently to provide dies for the bonding process. Each device wafer may include the same or different structures/devices. The number of device wafers and the structures/devices formed on the device wafers should not be limited by the embodiments of the present disclosure.

Figure 3B:
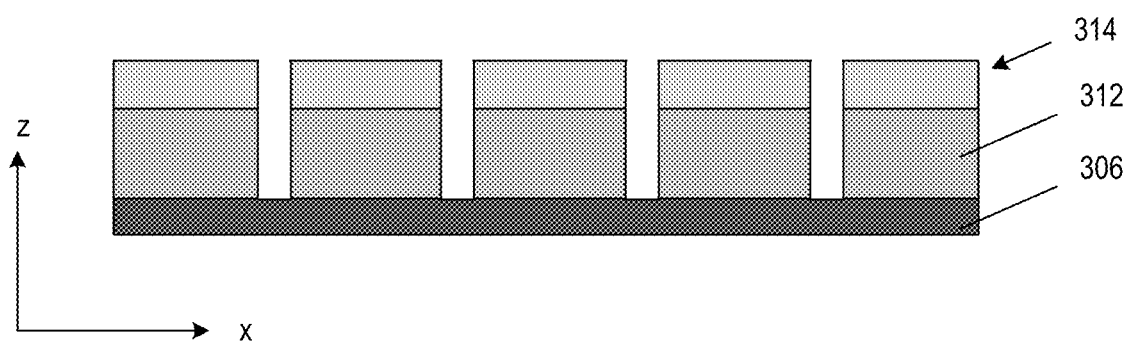

Method 300 proceeds to operation 504, as illustrated in FIG. 3B, in which the one or more device wafers are diced with the protection layer to perform a plurality of dies each under a respective protection layer portion. As shown in FIG. 3B, device wafer 302 and protection layer 304 may be diced to form a plurality of dies 312, each under a protection layer portion 314. Dies 312 may be attached to adhesive tape 306. In some embodiments, a bottom surface of die 312 is attached to adhesive tape 306 and protection layer portion 314 covers a top surface of die 312. Any suitable dicing operation may be performed to dice device wafer 302 and form dies 312. Each die 312 may include desired devices/structures for the subsequent bonding process. In some embodiments, more than one device wafer are diced to provided desired dies. The dicing of more than one device wafer is similar to the dicing of device wafer 302 and the detailed description is thus not repeated herein.

Figure 3C:
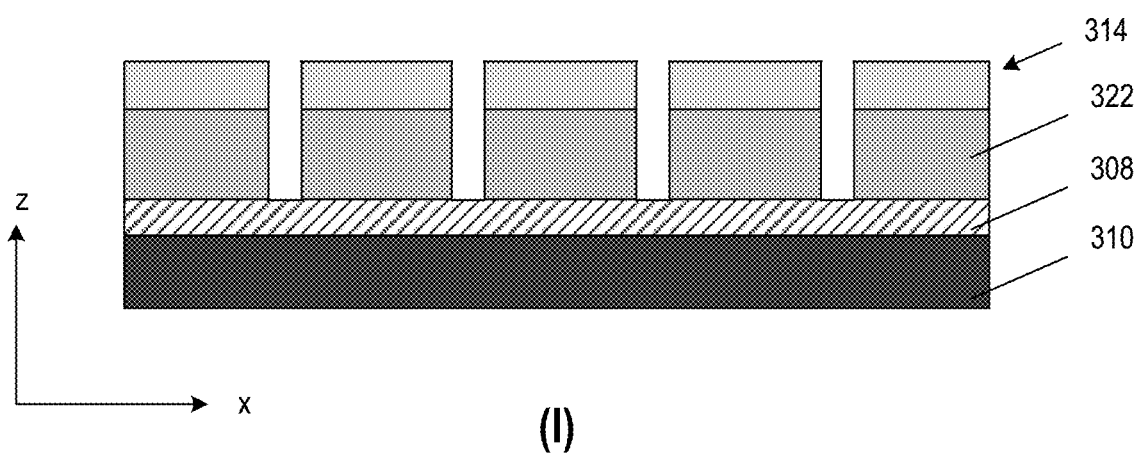
Figure 3C:
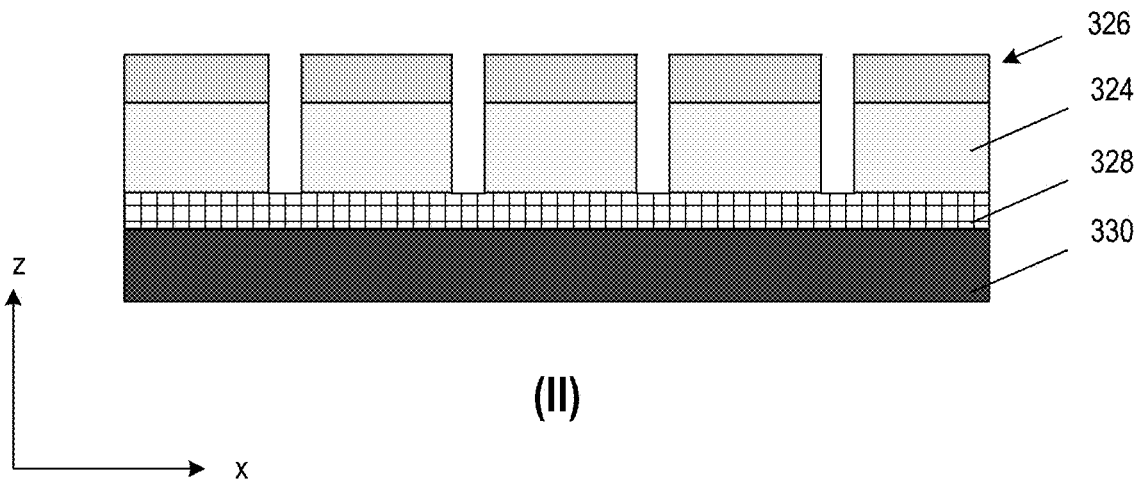

Method 300 proceeds to operation 506, as illustrated in FIG. 3C, in which a plurality of first dies are placed onto a first carrier wafer and a plurality of second dies are placed onto a second carrier wafer, each first die corresponding to a respective second die. As shown in FIG. 3C, (I) a plurality of first dies 322, each under a respective protection layer portion 314, may be placed on a first carrier wafer 310, and (II) a plurality of second dies 324, each under a respective protection layer portion 326, may be placed on a second carrier wafer 330. First carrier wafer 310 and second carrier wafer 330 may include any suitable material that has sufficient stiffness to support the respective dies during the bonding process, such as silicon and/or glass. First dies 322 and second dies 324 may be selected (e.g., by a die pick-up process) from the dies formed in Operation 504 and used for bonding. In some embodiments, first dies 322 and second dies 324 may be functional devices. In some embodiments, each first die 322 corresponds to a respective second die 324. Each first die 322 and the respective second die 324 may include suitable structures for bonding (e.g., bonding layer and/or bonding contacts) with each other.

An adhesion layer 308 may be between first dies 322 and first carrier wafer 310 to attach a bottom surface of each first die 322 to first carrier wafer 310. First dies 322 may then be held in place during the bonding process. Similarly, an adhesion layer 328 may be between second dies 324 and second carrier wafer 330 to attach a bottom surface of each second die 324 to second carrier wafer 330 and hold second dies 324 in place during the bonding process. Adhesion layers 308 and 328 may each include a plurality of adhesion portions, each under a respective die and each being laterally in contact with one another, e.g., adhesion layers 308 and 328 may extend consistently along lateral directions (e.g., along the x-direction). Adhesion layers 308 and 328 may be formed by any suitable process such as deposition and/or spinning on an adhesive onto first and second carrier wafers 310 and 330. In some embodiments, first dies 322 may have a uniform distribution on first carrier wafer 310 and second dies 324 may have a uniform distribution on second carrier wafer 330. In some embodiments, first dies 322 has full coverage over first carrier wafer 310 and second dies 324 has full coverage over second carrier wafer 330.

Figure 3D:
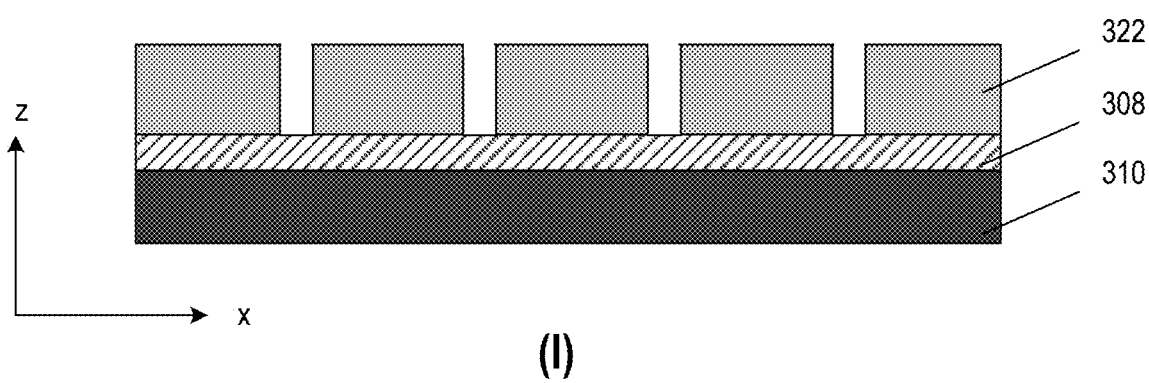
Figure 3D:
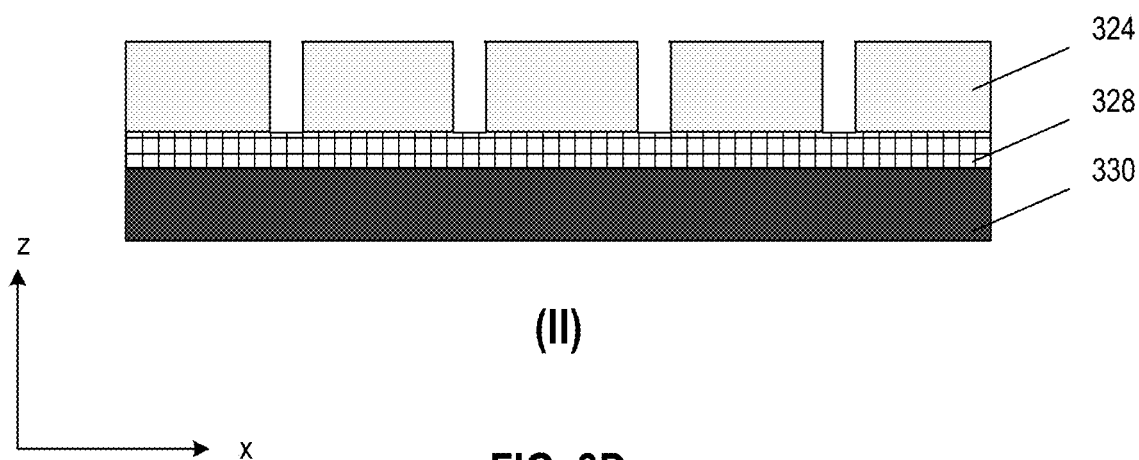
Figure 3E:
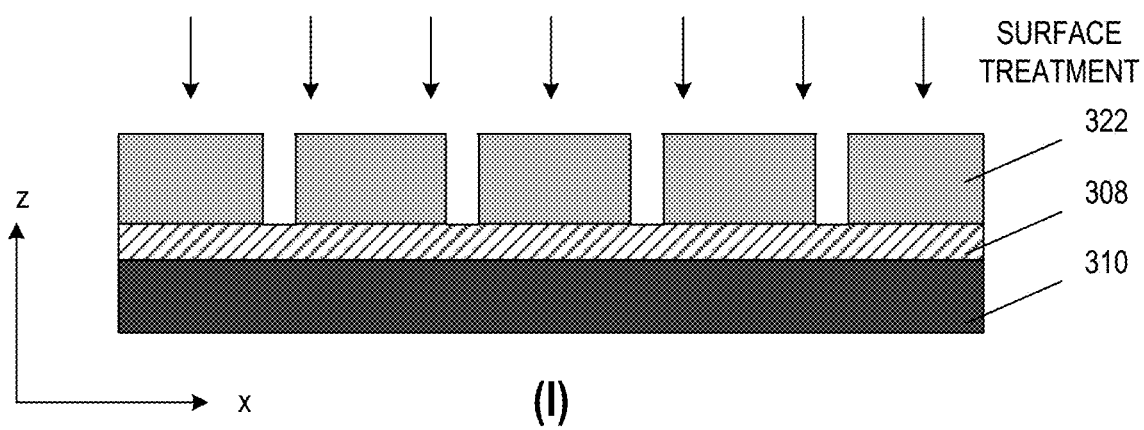
Figure 3E:
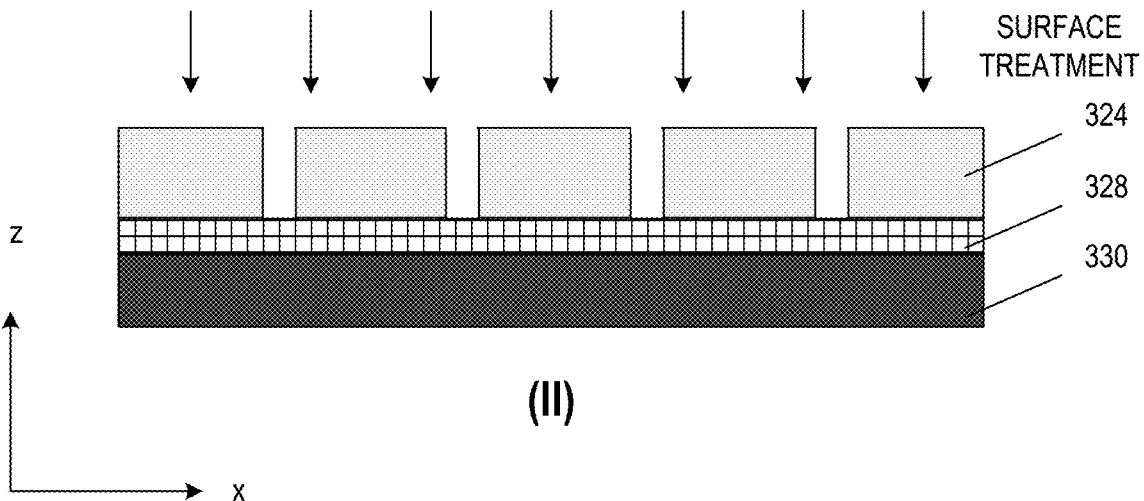

Method 300 proceeds to operation 508, as illustrated in FIGS. 3D and 3E, in which the respective protection layer portion over each first and second die is removed, and a surface treatment is performed on the first and the second dies. As shown in FIG. 3D, protection layer portion 314 is removed from each first die 322, and protection layer portion 326 is removed from each second die 324. First dies 322 and second dies 324 may be respective exposed. The removal of protection layer portions may include any suitable process, depending on the material(s) of protection layer portions 314 and 326. For example, if the protection layer portions (e.g., 314 and 326) include hard materials (e.g., carbon, silicon oxide, and/or silicon nitride), the removal process may include an etching (e.g., dry etch and/or wet etch) and/or a chemical mechanical planarization (CMP) process. In some embodiments, the protection layer portions (e.g., 314 and 326) include photoresist, and the removal process may include rinsing in a photoresist remover and/or a plasma treatment (e.g., oxygen plasma combustion).

As shown in FIG. 3E, a respective surface treatment is performed on first dies 322 and second dies 324 to prepare first dies 322 and second dies 324 for bonding. Depending on the type of bonding and the bonds formed between dies, any suitable surface treatment may be performed. In some embodiments, the bonding process includes a hybrid bonding and the surface treatment includes a plasma activation process. In some embodiments, the surface treatment also includes a wet treatment and/or a thermal treatment.

Figure 3F:
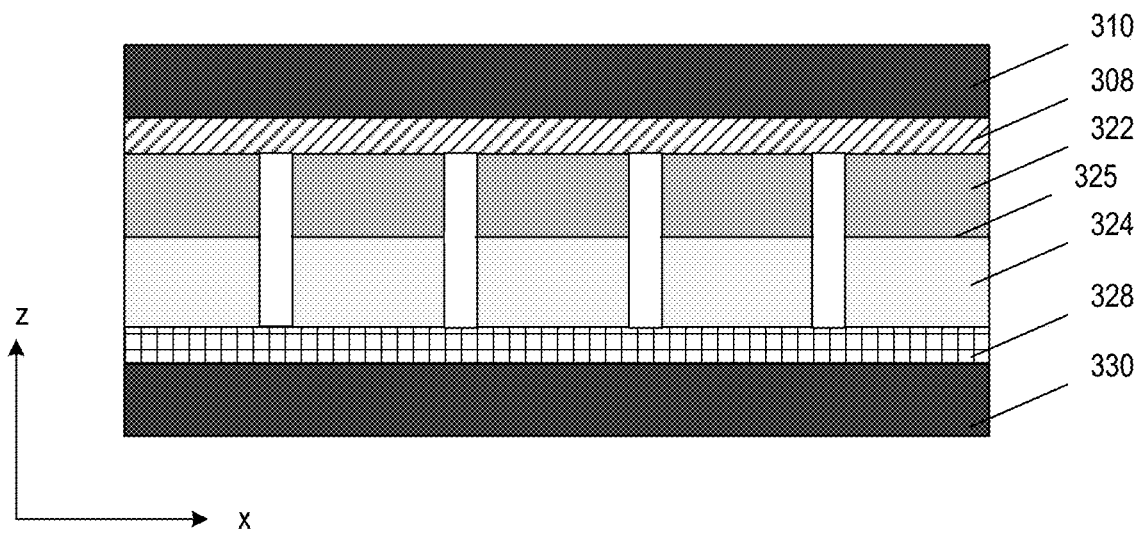

Method 300 proceeds to operation 510, as illustrated in FIG. 3F, in which one of the first carrier wafer and the second carrier wafer is flipped to bond the first dies and the second dies. As shown in FIG. 3F, first carrier wafer 310 is flipped upside down so each first die 322 is aligned with and bonded to a respective second die 324. In some embodiments, each first die 322 and the respective second die 324 are in a face-to-face manner so the bonding layer and/or bonding contacts of first die 322 can be aligned and facing the bonding layer and/or bonding contacts of second die 324. In some embodiments, the bonding process includes hybrid bonding and pressure and/or thermal treatment can be applied on one or both of first carrier wafer 310 and second carrier wafer 330. A bonding interface 325 can be formed between first die 322 and the respective second die 324. In some embodiments, upon contact, bonding contacts of first and second dies 322 and 324 can form fusion bond at bonding interface 325, and dielectric materials of first and second dies 322 and 324 can form covalent bond at bonding interface 325. Each first die 322 and the respective second die 324 may thus form a respective bonded semiconductor device.

Figure 3G:
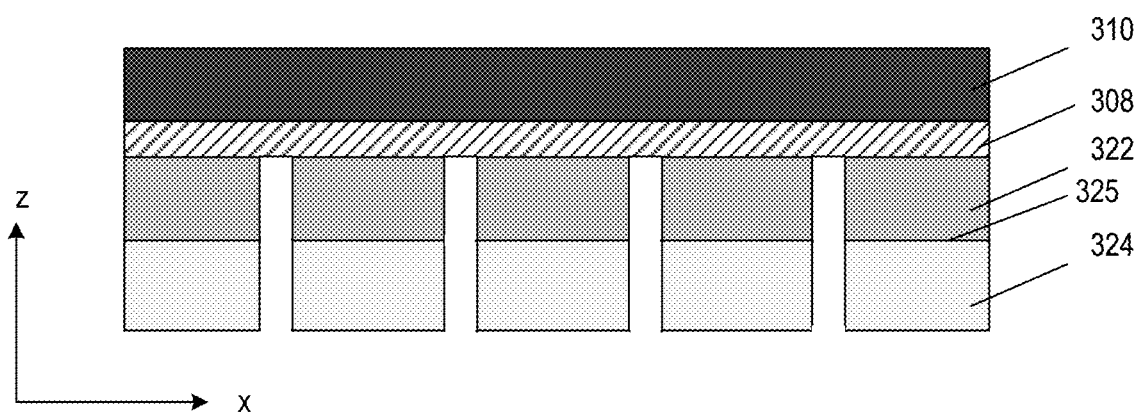
Figure 3H:
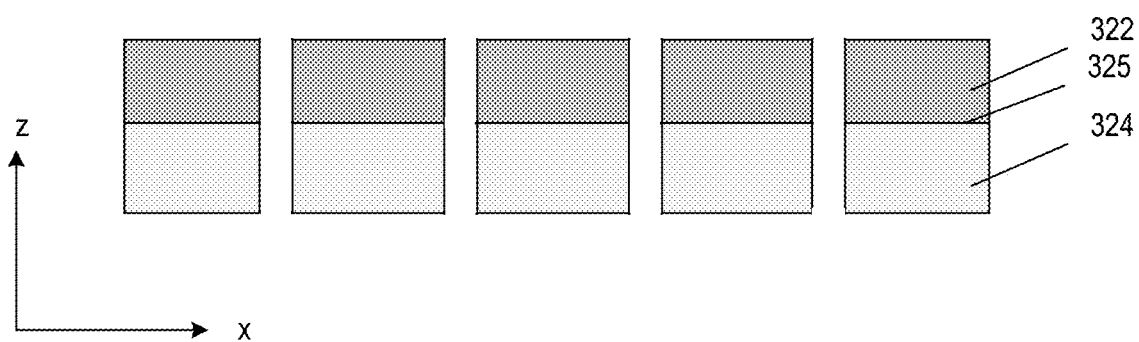

Method 300 proceeds to operation 512, as illustrated in FIGS. 3G and 3H, in which the first and the second carrier wafers are respectively removed from the bonded semiconductor devices. As shown in FIGS. 3G and 3H, second carrier wafer 330 and adhesion layer 328 are removed, and first carrier wafer 310 and adhesion layer 308 are removed subsequently. In some embodiments, first carrier wafer 310 and adhesion layer 308 are removed before the removal of second carrier wafer 330 and adhesion layer 328. Any suitable debonding processes can be employed to remove the carrier wafers and the respective adhesion layers. For example, the debonding processes may include a suitable etching process (e.g., dry etch and/or wet etch) to remove the adhesion layers. In some embodiments, the adhesion layers can be dissolved and/or etched away to detach the bonded semiconductor devices from the respective carrier wafers. In some embodiments, a force may be applied to remove the carrier wafers. The plurality of bonded semiconductor devices, each including a pair of first die 322 and second die 324 bonded at bonding interface 325, can then be de-bonded from first and second carrier wafers 310 and 330.

Figure 4A:
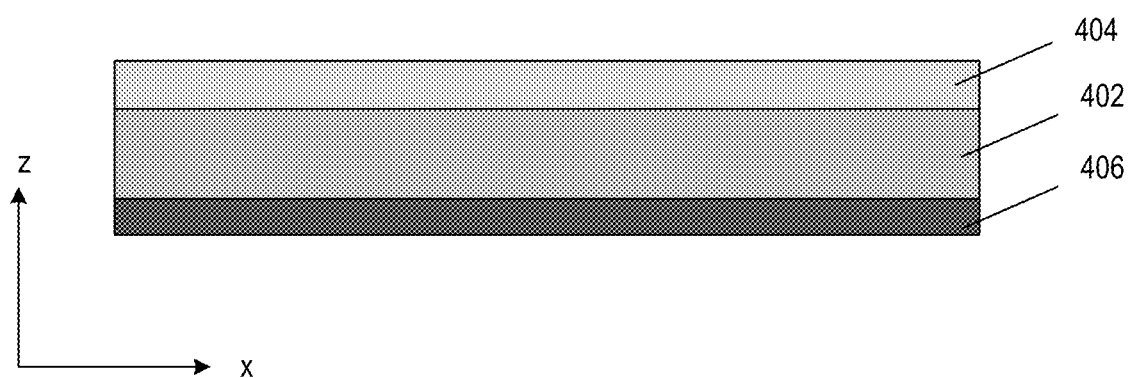
FIGS. 4A-4H illustrates another exemplary fabrication process for forming a plurality of bonded semiconductor devices, according to some embodiments.
Figure 4B:
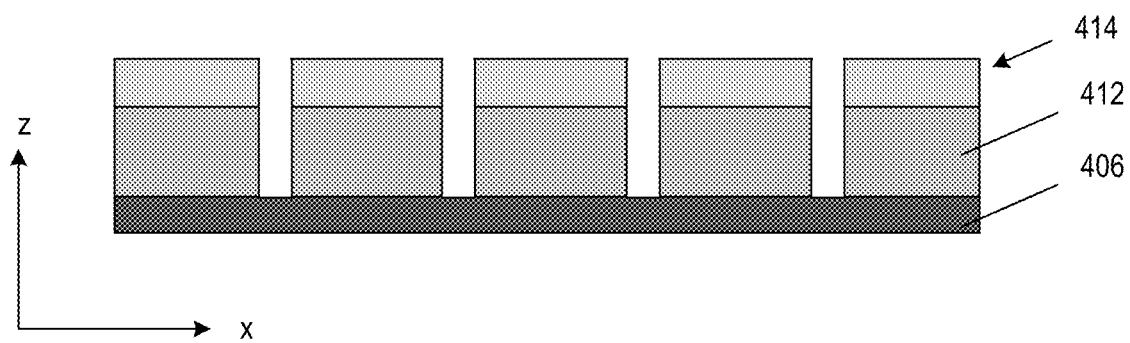

FIGS. 4A-4H illustrate another exemplary fabrication method 400 for forming the bonded semiconductor devices, according to some embodiments. FIG. 5B illustrates a flowchart 550 of fabrication method 400. For ease of illustration, FIGS. 4A-3H and 5B are described together. It is understood that the operations shown in method 400 are not exhaustive and that other operations can be performed as well before, after, or between any of the illustrated operations. Further, some of the operations may be performed simultaneously, or in a different order than shown in FIG. 5B. For simplicity of description, operations in method 400 that are same as or similar to the operations in method 300 are not described in detail.

Referring to FIG. 5B, method 400 starts at operation 552, as illustrated in FIG. 4A, in which a protection layer is formed over one or more device wafers. As shown in FIG. 4A, a protection layer 404 is formed over a device wafer 402, which is attached to an adhesive tape 406. Method 400 proceeds to operation 554, as illustrated in FIG. 4B, in which the one or more device wafers are diced with the protection layer to perform a plurality of dies each under a respective protection layer portion. As shown in FIG. 4B, device wafer 402 and protection layer 404 are diced to form a plurality of dies 412, each under a respective protection layer portion 414. Operations 552 and 554 may be similar to or the same as operations 502 and 504, respectively, and the detailed description is not repeated herein.

Figure 4C:
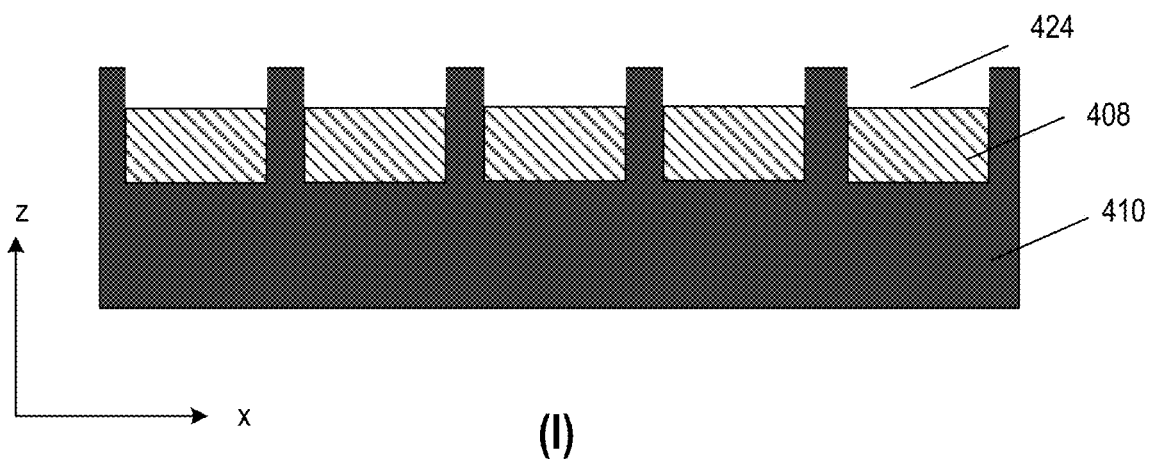
Figure 4C:
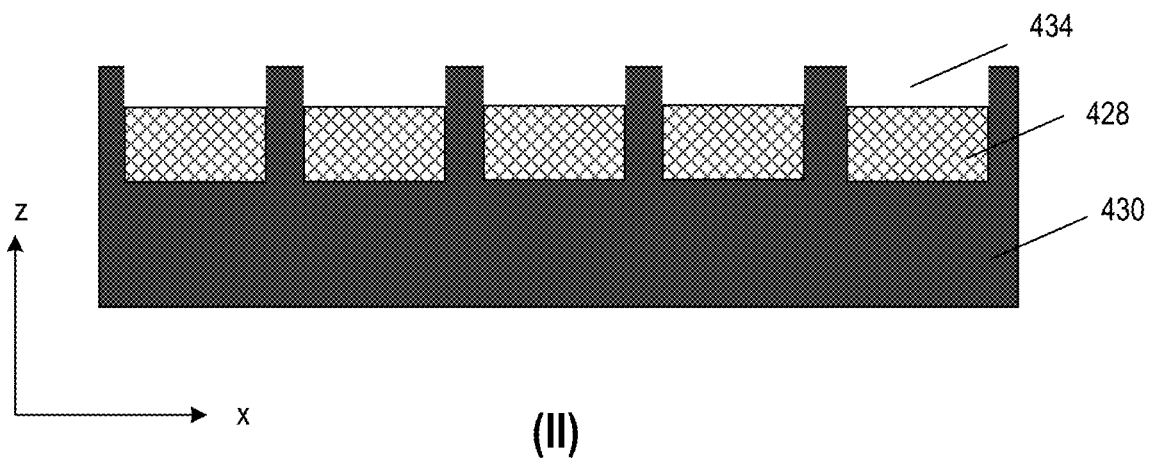
Figure 5B:
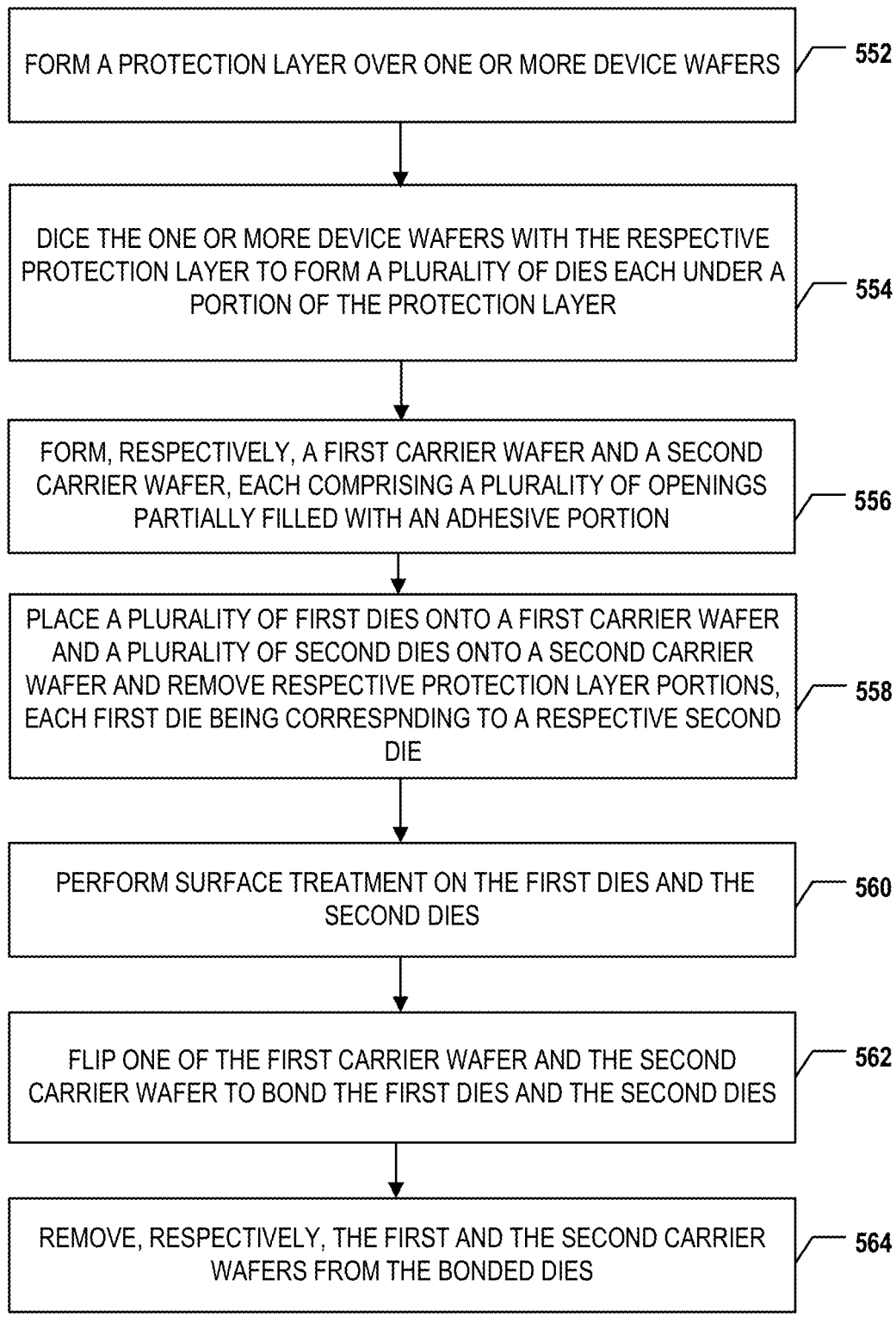

Method 400 proceeds to operation 556, as illustrated in FIG. 4C, a first carrier wafer and a second carrier wafer are respectively formed to each include a plurality of openings. The openings may each be partially filled with an adhesive portion. Operation 556 may be performed at any suitable time before the placement of dies. In some embodiments, operation 556 may also be performed before or at the same time as operations 552 and 554.

As shown in FIG. 4C, (I) a first carrier wafer 410 and (II) a second carrier wafer 430 are formed. In some embodiments, first carrier wafer 410 and second carrier wafer 430 may include any suitable material(s) with sufficient stiffness to hold and support the respective dies in the bonding process. In some embodiments, first carrier wafer 410 and second carrier wafer 430 include silicon. First carrier wafer 410 may include a plurality of openings, each being partially filled with an adhesive portion 408 at the bottom of the opening. The remaining space 424 in the opening over adhesive portion 408 may be retained for the placement of a corresponding first die. A lateral dimension (e.g., width/length along the x-direction) or space 424 may be sufficient for a corresponding first die to be placed in. A vertical dimension (e.g., depth along the z-direction) of space 424 may be less than or equal to a thickness of the corresponding first die. The openings may also be referred to as sockets. Similarly, second carrier wafer 430 includes a plurality of openings, each being partially filled with an adhesive portion 428 at the bottom of the opening. The remaining space 434 in the opening over adhesive portion 428 may be retained for the placement of a corresponding second die. A lateral dimension (e.g., width/length along the x-direction) of space 434 may be sufficient for a corresponding second die to be placed. A vertical dimension (e.g., depth along the z-direction) of space 434 may be less than or equal to a thickness of the corresponding second die. A suitable etching process such as dry etch and/or wet etch may be performed to form the openings in the carrier wafers. Adhesion portions 408 and 428 may be disconnected from one another by the respective carrier wafer along lateral directions (e.g., along the x-direction). Adhesive portions 408 and 428 may be formed by any suitable methods such as deposition and/or spinning on the adhesive into each opening of the respective carrier wafer 410 or 430.

Figure 4D:
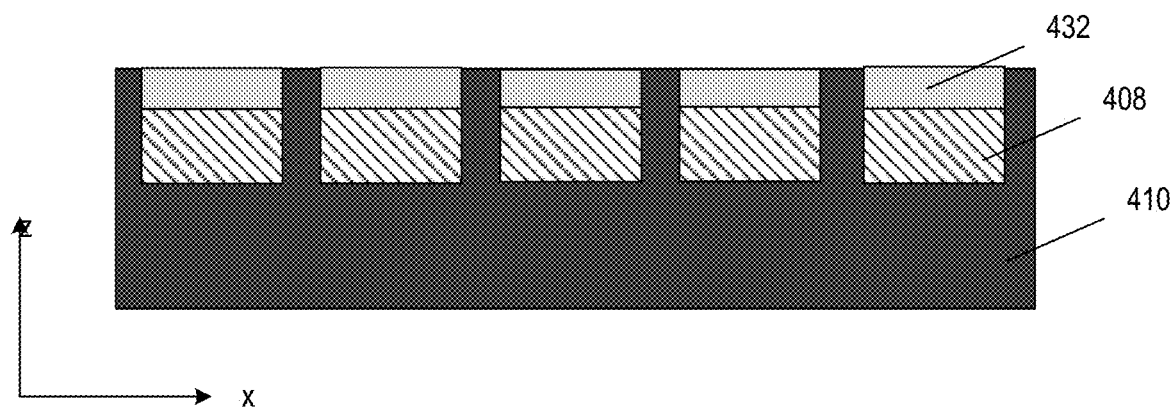
Figure 4D:
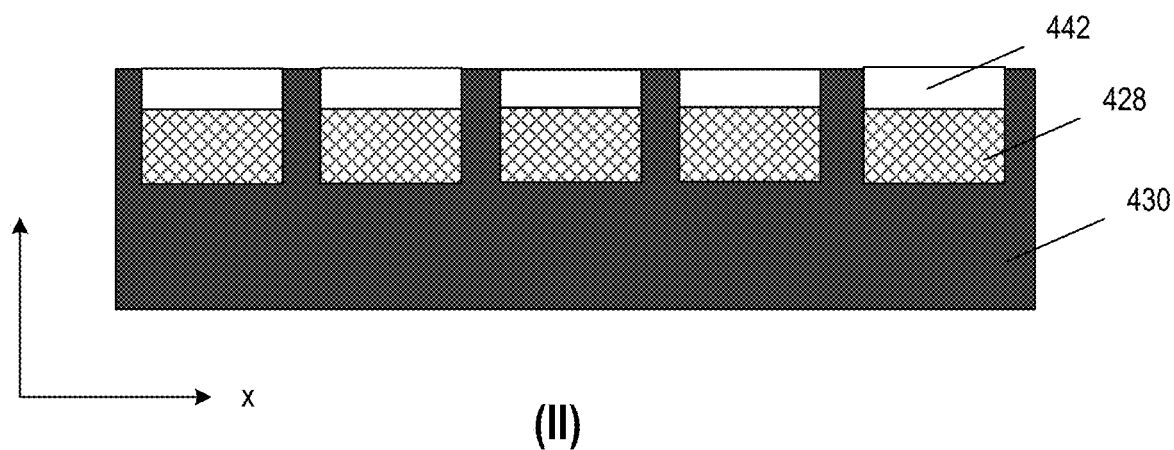

Method 400 proceeds to operation 558, as illustrated in FIG. 4D, in which a plurality of first dies are placed onto a first carrier wafer and a plurality of second dies are placed onto a second carrier wafer, each first die corresponding to a respective second die. The respective protection layer portions over first dies and second dies are removed.

As shown in FIG. 4D (I) a plurality of first dies 432 may be placed into the plurality of openings in first carrier wafer 410, and (II) a plurality of second dies 442 may be placed into the plurality of openings in second carrier wafer 430. The protection layer portions over first dies 432 and second dies 442 can be removed. First dies 432 and second dies 442 may be functional dies, selected from the dies formed in Operation 554, similar to first dies 322 and second dies 324. Each first die 432 may be attached to first carrier wafer 410 through the respective adhesion portion 408, and each second die 442 may be attached to second carrier wafer 430 through the respective adhesion portion 428. The removal of protection layer portions over first and second dies 432 and 442 may be similar to the removal of protection layer portions over first and second dies 322 and 324, and detailed description is thus not repeated herein. In some embodiments, first dies 432 may have a uniform distribution on first carrier wafer 410 and second dies 442 may have a uniform distribution on second carrier wafer 430. In some embodiments, first dies 432 has full coverage over first carrier wafer 410 and second dies 442 has full coverage over second carrier wafer 430.

Figure 4E:
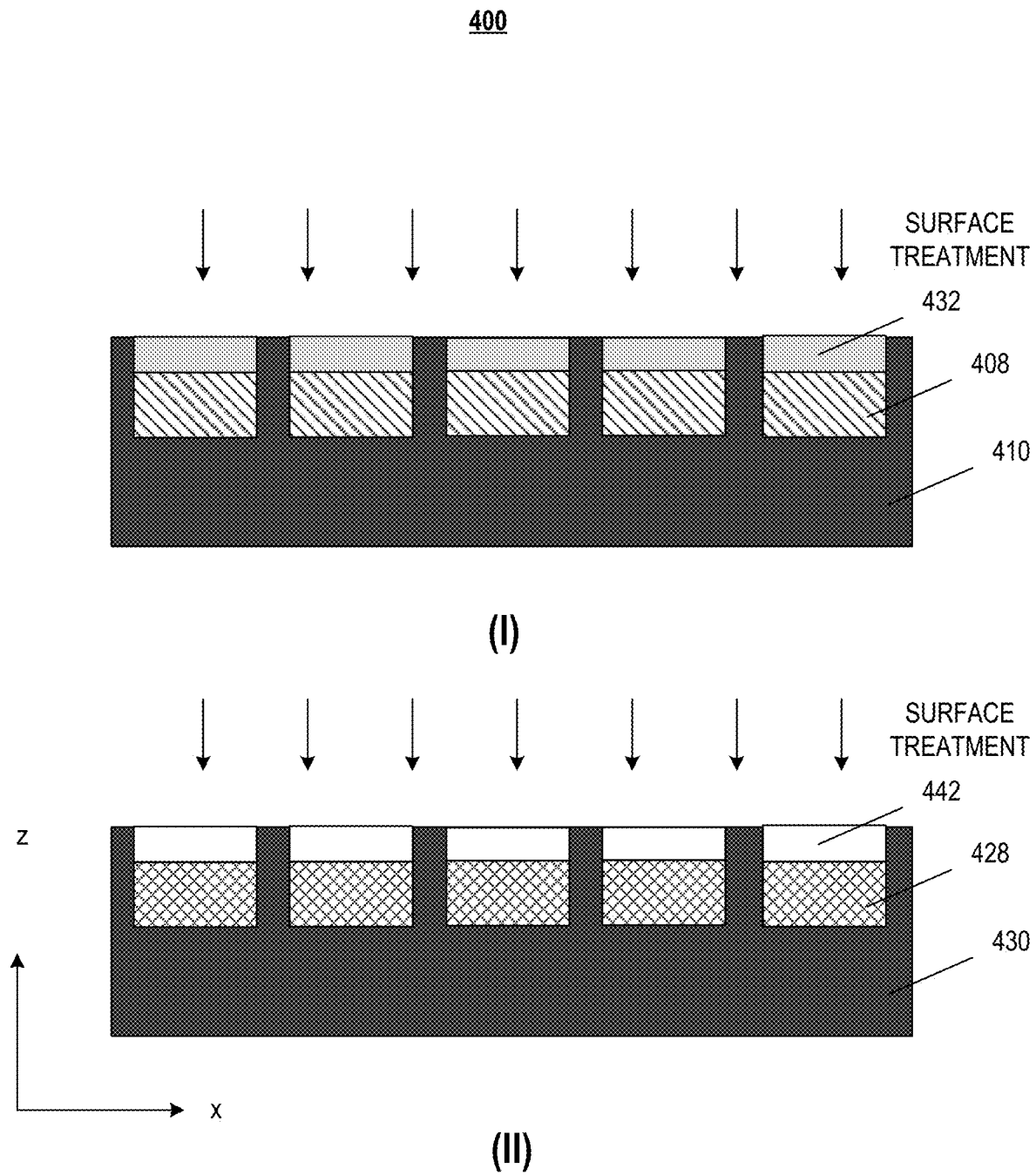

Method 400 proceeds to operation 560, as illustrated in FIG. 4E, in which a surface treatment is performed on the first and second dies. As shown in FIG. 4E, a surface treatment is respectively performed on first dies 432 and 442. The surface treatments may be similar to or the same as the surface treatments applied on first dies 322 and second dies 324, and the detailed description is thus not repeated herein.

Figure 4F:
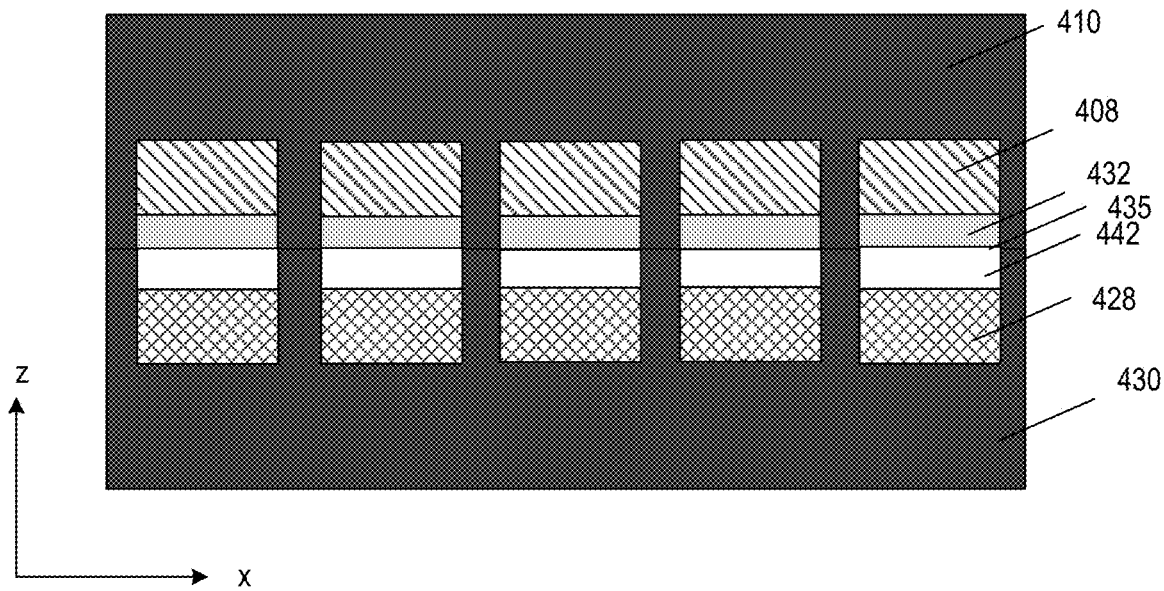

Method 400 proceeds to operation 562, as illustrated in FIG. 4F, in which one of the first and second carrier wafers is flipped to bond the first dies and the second dies. As shown in FIG. 4F, first carrier wafer 410 is flipped upside down to bond first dies 432 and 442. The alignment and bonding of first dies 432 and second dies 442 may be similar to or the same as the alignment and bonding of first dies 322 and 324, and the detailed description is thus not repeated herein. In some embodiments, the top surfaces of first dies 432 may be coplanar with or higher than the top surface of first carrier wafer 410. In some embodiments, the top surfaces of second dies 442 may be coplanar with or higher than the top surface of second carrier wafer 430. In some embodiments, hybrid bonding is performed on first dies 432 and second dies 442 to form fusion bond and covalent bond at a bonding interface 435 between each first die 432 and the respective second die 442. A bonded semiconductor device may be formed. In some embodiments, little or no bond is formed between first carrier wafer 410 and second carrier wafer 430.

Figure 4G:
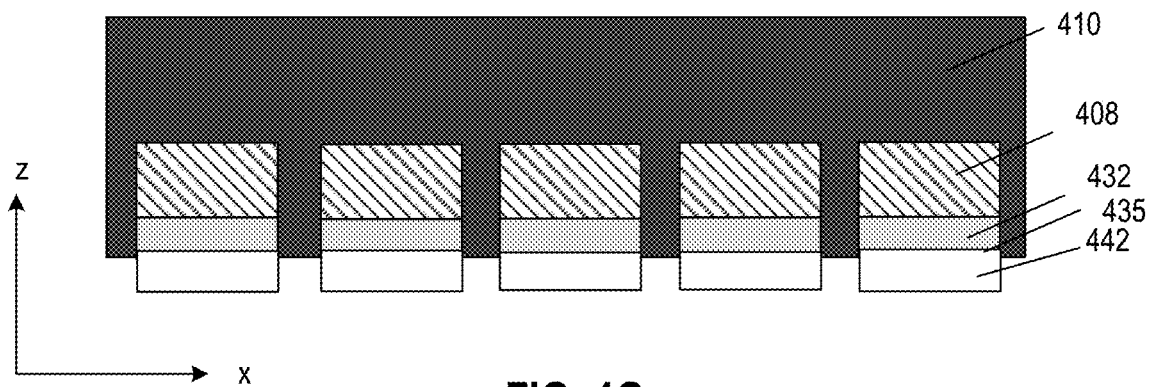
Figure 4H:
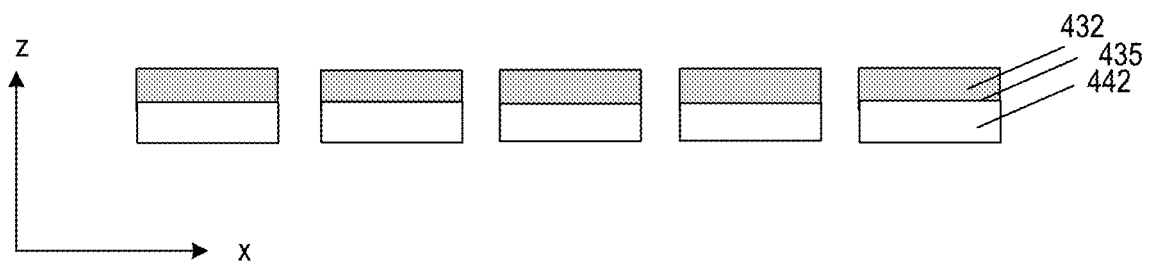

Method 400 proceeds to operation 564, as illustrated in FIGS. 4G and 4H, in which the first and the second carrier wafers are respectively removed from the bonded semiconductor devices. As shown in FIGS. 4G and 4H, second carrier wafer 430 and adhesion portions 428 are removed, and first carrier wafer 410 and adhesion portions 408 are removed subsequently. The removal of first and second carrier wafers 410 and 430, and the respective adhesion portions may be similar to or the same as the removal of first and second carrier wafers 310 and 330 and the respective adhesion layers, and the detailed description is thus not repeated herein.

In some embodiments, a method for bonding includes dicing one or more device wafers to obtain a plurality of dies, placing at least one first die of the plurality of dies onto a first carrier wafer and at least one second die of the plurality of dies onto a second carrier wafer, and bonding the at least one first die each with a respective second die. The at least one first die and the at least one second die each are functional. In some embodiments, the method also includes removing, respectively, the first carrier wafer and the second carrier wafer to form a plurality of bonded semiconductor devices each having one of the first dies and the respective second die.

In embodiments, the method includes forming a respective protection layer over the one or more device wafers before the dicing. In some embodiments, the method also includes dicing, with the respective protection layer, the one or more device wafers to form the plurality of dies each under a respective protection layer portion.

In some embodiments, the first carrier wafer and the second carrier wafer each includes a respective adhesive layer on a surface that is in contact with the respective dies. In some embodiments, placing the at least one first die and the at least one second die onto the respective carrier wafer includes attaching the at least one first die and the at least one second die to the respective adhesive layer. The portion of the respective protection layer face away from the adhesive layer.

In some embodiments, forming the adhesive layer includes forming a plurality of adhesion portions on the surface in contact with the respective dies, the plurality of adhesion portions being in contact with one another. In some embodiments, placing the at least one first die and the at least one second die onto the respective carrier wafer includes attaching the at least one first die and the at least one second die to the respective adhesive portion of the respective adhesive layer.

In some embodiments, the method further includes forming a plurality of respective openings in the first carrier wafer and the second carrier wafer. Forming the adhesive layer may include forming an adhesive portion on the bottom of each of the openings, and attaching the at least one first die and the at least one second die to the respective adhesive layer may include placing the at least one first die and the at least one second die each into a respective opening of the respective carrier wafer.

In some embodiments, the method further includes removing the respective protection layer portion from each of the at least one first die and the at least one second die.

In some embodiments, the method further includes performing a respective surface treatment on each of the at least one first die and the at least one second die after the respective protection layer portion is removed.

In some embodiments, the method further includes, before the bonding, flipping one of the first carrier wafer and the second carrier wafer. In some embodiments, the method also includes aligning each of the at least one first die with the respective second die.

In some embodiments, the bonding comprises hybrid bonding.

In some embodiments, placing the at least one first dies includes placing the at least one first dies in a uniform distribution on the first carrier wafer.

In some embodiments, the method further includes placing the at least one first dies in full coverage over the first carrier wafer.

In some embodiments, a method for bonding includes dicing one or more device wafers to obtain a plurality of dies and placing at least one first die of the plurality of dies into respective first openings in a first carrier wafer. The at least one first die includes a uniform distribution on the first carrier wafer. In some embodiments, the method further includes bonding the at least one first die with a device layer on a second carrier wafer and removing, respectively, the first carrier wafer and the second carrier wafer.

In some embodiments, the method further includes placing the at least one first dies in full coverage over the first carrier wafer.

In some embodiments, the method further includes placing at least one second die of the plurality of dies into respective second openings in the second carrier wafer to form the device layer and flipping one of the first carrier wafer and the second carrier wafer to align each of the at least one first die with a corresponding one of the at least one second dies before the bonding.

In some embodiments, the method further includes forming a respective protection layer over the one or more device wafers and dicing, with the respective protection layer, the one or more device wafers to form the plurality of first dies and the plurality of second dies each under a respective protection layer portion.

In some embodiments, the method further includes forming the first openings in the first carrier wafer and the second openings in the second carrier wafer, forming an adhesive portion on the bottom of each of the first openings and second openings, and attaching the at least one first die and the at least one second die each to a respective adhesive portion in the respective opening.

In some embodiments, the method further includes removing the respective protection layer portion from each of the at least one first die and the at least one second die.

In some embodiments, the method further includes performing a respective surface treatment on each of the at least one first die and the at least one second die after the portion of the respective protection layer is removed.

In some embodiments, the bonding comprises hybrid bonding.

In some embodiments, a structure for bonding includes a plurality of first openings in a first carrier wafer, a first adhesive portion on a bottom of each of the plurality of first openings, and a first die attached to the adhesive portion in each of the plurality of first openings.

In some embodiments, the structure further includes a plurality of second openings in a second carrier wafer, a second adhesive portion on a bottom of each of the plurality of second openings, and a second die attached to the second adhesive portion in each of the plurality of second openings. Top surfaces of the plurality of first dies are bonded to top surfaces of the plurality of second dies, forming a plurality of bonded semiconductor devices.

In some embodiments, the top surfaces of the plurality of first dies are coplanar with or higher than a top surface of the first carrier wafer, and the top surfaces of the plurality of second dies are coplanar with or higher than a top surface of the second carrier wafer.

In some embodiments, a bond between the plurality of first dies and the plurality of second dies comprise fusion bonding and covalent bonding.

In some embodiments, the plurality of bonded semiconductor devices have a uniform distribution over the first carrier wafer and the second carrier wafer.

In some embodiments, the plurality of bonded semiconductor devices have full coverage over the first carrier wafer and the second carrier wafer.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:
1. A method for bonding, comprising:
dicing one or more device wafers to obtain a plurality of dies;
placing at least one first die of the plurality of dies onto a first carrier wafer and at least one second die of the plurality of dies onto a second carrier wafer, the at least one first die and the at least one second die each being functional, wherein:
each first die comprises:
a 3D NAND memory array including an array of 3D NAND memory strings on a first side of a first semiconductor layer,
a first interconnect layer including a plurality of first interconnects coupled with the array of 3D NAND memory strings,
a first bonding layer including a plurality of first bonding contacts coupled with the plurality of first interconnects,
a pad-out interconnect layer on a second side of the first semiconductor layer opposite to the first side, and
at least one contact pad in the pad-out interconnect layer configured to transfer electrical signals to outside circuits;
each second die comprises:
an embedded DRAM array including an array of embedded DRAM cells on a second semiconductor layer,
a periphery circuit including a plurality of peripheral transistors on the second semiconductor layer and configured to control operations of the 3D NAND memory array and the embedded DRAM array,
a second interconnect layer including a plurality of second interconnects coupled with the array of embedded DRAM cells and the plurality of peripheral transistors, and
a second bonding layer including a plurality of second bonding contacts coupled with the plurality of second interconnects;
bonding the at least one first die each with a respective second die; and
completely removing, respectively, the first carrier wafer and the second carrier wafer to form a plurality of bonded semiconductor devices each comprising one first die and the respective second die.
2. The method of claim 1, further comprising:
forming a respective protection layer over the one or more device wafers before the dicing; and dicing, with the respective protection layer, the one or more device wafers to form the plurality of dies each under a respective protection layer portion.

3. The method of claim 2, wherein:
the first carrier wafer and the second carrier wafer each comprises a respective adhesive layer on a surface that is in contact with the respective dies; and
placing the at least one first die and the at least one second die onto the respective carrier wafer comprises attaching the at least one first die and the at least one second die to the respective adhesive layer, the portion of the respective protection layer facing away from the adhesive layer.

4. The method of claim 3, wherein:
forming the adhesive layer comprises forming a plurality of adhesion portions on the surface in contact with the respective dies, the plurality of adhesion portions being in contact with one another; and
placing the at least one first die and the at least one second die onto the respective carrier wafer comprises attaching the at least one first die and the at least one second die to the respective adhesive portion of the respective adhesive layer.

5. The method of claim 3, further comprising forming a plurality of respective openings in the first carrier wafer and the second carrier wafer, wherein:
forming the adhesive layer comprises forming an adhesive portion on the bottom of each of the openings; and
attaching the at least one first die and the at least one second die to the respective adhesive layer comprises placing the at least one first die and the at least one second die each into a respective opening of the respective carrier wafer.

6. The method of claim 3, further comprising removing the respective protection layer portion from each of the at least one first die and the at least one second die.

7. The method of claim 6, further comprising performing a respective surface treatment on each of the at least one first die and the at least one second die after the respective protection layer portion is removed.

8. The method of claim 1, wherein the bonding comprises hybrid bonding.

9. The method of claim 1, wherein placing the at least one first die comprises placing a plurality of first dies in a uniform distribution on the first carrier wafer.

10. The method of claim 9, further comprising placing the plurality of first dies in full coverage over the first carrier wafer.

11. The method of claim 1, wherein bonding the at least one first die each with the respective second die comprises:
hybrid bonding the first bonding layer with the second bonding layer, such that the plurality of first bonding contacts are joined with the plurality of second bonding contacts respectively at a bonding interface.

12. A method for bonding, comprising:
dicing a first device wafer to obtain a plurality of first dies each including:
a 3D NAND memory array including an array of 3D NAND memory strings on a first side of a first semiconductor layer,
a first interconnect layer including a plurality of first interconnects coupled with the array of 3D NAND memory strings,
a first bonding layer including a plurality of first bonding contacts coupled with the plurality of first interconnects,
a pad-out interconnect layer on a second side of the first semiconductor layer opposite to the first side, and
at least one contact pad in the pad-out interconnect layer configured to transfer electrical signals to outside circuits;
dicing a second device wafer to obtain a plurality of second dies each including:
an embedded DRAM array including an array of embedded DRAM cells on a second semiconductor layer,
a periphery circuit including a plurality of peripheral transistors on the second semiconductor layer and configured to control operations of the 3D NAND memory array and the embedded DRAM array,
a second interconnect layer including a plurality of second interconnects coupled with the array of embedded DRAM cells and the plurality of peripheral transistors, and
a second bonding layer including a plurality of second bonding contacts coupled with the plurality of second interconnects;
placing the plurality of first dies onto a first carrier wafer and the plurality of second dies onto a second carrier wafer;
bonding the plurality of first dies and the plurality of second dies, such that each first die is joined with a corresponding second die; and
completely removing the first carrier wafer and the second carrier wafer to form a plurality of bonded semiconductor devices each comprising one first die and the corresponding second die.

13. The method of claim 12, further comprising: forming a respective protection layer over the first and second device wafers before the dicing; and after dicing the first and second device wafers, each of the plurality of first and second dies is under a respective protection layer portion.

14. The method of claim 13, wherein:
the first carrier wafer and the second carrier wafer each comprises a respective adhesive layer on a surface that is in contact with the respective first and second dies; and
placing the at least one first die and the at least one second die onto the respective carrier wafer comprises attaching the at least one first die and the at least one second die to the respective adhesive layer, the portion of the respective protection layer facing away from the adhesive layer.

15. The method of claim 14, wherein:
forming the adhesive layer comprises forming a plurality of adhesion portions on the surface in contact with the respective first and second dies, the plurality of adhesion portions being in contact with one another; and
placing the at least one first die and the at least one second die onto the respective carrier wafer comprises attaching the at least one first die and the at least one second die to the respective adhesive portion of the respective adhesive layer.

16. The method of claim 15, further comprising forming a plurality of respective openings in the first carrier wafer and the second carrier wafer, wherein:
forming the adhesive layer comprises forming an adhesive portion on the bottom of each of the openings; and
attaching the at least one first die and the at least one second die to the respective adhesive layer comprises placing the at least one first die and the at least one second die each into a respective opening of the respective carrier wafer.

17. The method of claim 15, further comprising:
removing the respective protection layer portion from each of the at least one first die and the at least one second die; and
performing a respective surface treatment on each of the at least one first die and the at least one second die after the respective protection layer portion is removed.

18. The method of claim 12, wherein placing the at least one first die comprises placing a plurality of first dies in a uniform distribution on the first carrier wafer.

19. The method of claim 18, further comprising placing the plurality of first dies in full coverage over the first carrier wafer.

20. The method of claim 12, wherein bonding the plurality of first dies and the plurality of second dies comprises:
hybrid bonding the first bonding layer with the second bonding layer, such that the plurality of first bonding contacts are joined with the plurality of second bonding contacts respectively at a bonding interface.

\* \* \* \* \*